(12) United States Patent
Sullivan et al.

(10) Patent No.: US 8,374,811 B2
(45) Date of Patent: Feb. 12, 2013

(54) HIGH WAVEFORM THROUGHPUT WITH A LARGE ACQUISITION MEMORY

(75) Inventors: Steven K. Sullivan, Beaverton, OR (US); Kristie L. Veith, Portland, OR (US); Terrance R. Beale, Portland, OR (US); Paul M. Gerlach, Beaverton, OR (US); Gregory A. Martin, Portland, OR (US); George S. Walker, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 245 days.

(21) Appl. No.: 12/631,968

(22) Filed: Dec. 7, 2009

(65) Prior Publication Data

US 2011/0137594 A1 Jun. 9, 2011

(51) Int. Cl.
*G06F 19/00* (2011.01)
*G01R 13/02* (2006.01)
(52) U.S. Cl. ........................................................ 702/68
(58) Field of Classification Search .................... 702/68, 702/66; 714/724, 731; 324/77 B, 121 R; 340/722, 744; 345/440.1
See application file for complete search history.

(56) References Cited

U.S. PATENT DOCUMENTS

| | | | | |
|---|---|---|---|---|
| 4,829,293 | A | * | 5/1989 | Schlater ................. 345/440.1 |
| 6,584,419 | B1 | * | 6/2003 | Alexander ................. 702/68 |
| 2007/0226406 | A1 | | 9/2007 | Beale et al. |

* cited by examiner

*Primary Examiner* — Bryan Bui
(74) *Attorney, Agent, or Firm* — Kaname Kamibayashi; Thomas F. Lenihan

(57) ABSTRACT

A waveform display apparatus and method displays one or more waveforms of a signal under test at high throughput while acquiring digital data of the signal under test in a large acquisition memory. A user sets a time interval of user's interest when viewing a signal under test and sets trigger criteria through a user interface. An ADC converts the signal under test into digital data that is stored in a large acquisition memory. A trigger unit detects and produces trigger events, based on a trigger, as trigger event information during one acquisition process. A trigger event eliminator may discard some of the trigger events based on pre-trigger and post-conditions set through the interface by a user. The trigger events are recorded in a trigger list as the trigger event information. A control unit locates the digital data in the acquisition memory corresponding to the trigger events in the trigger list and displays a waveform associated with the trigger event for the time interval on a display device.

18 Claims, 8 Drawing Sheets

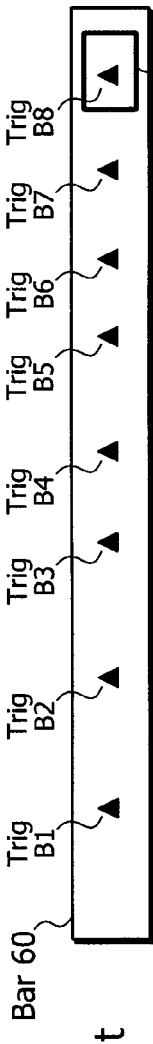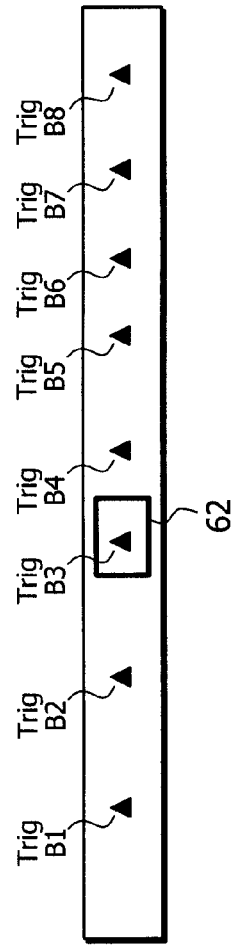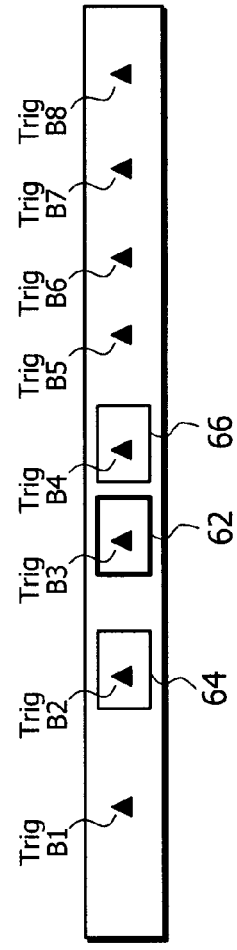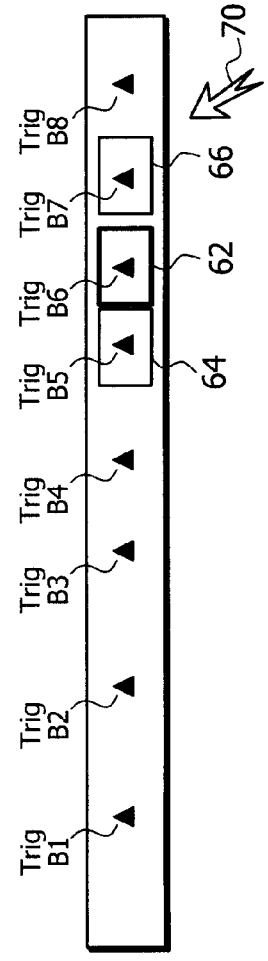
FIG. 6A Default    FIG. 6B Pan Left    FIG. 6C Zoom Out    FIG. 6D Pan Right

HIGH WAVEFORM THROUGHPUT WITH A LARGE ACQUISITION MEMORY

FIELD OF THE INVENTION

The subject invention concerns the field of test and measurement instruments, in general, and specifically relates to acquisition of signals in a digital storage oscilloscope.

BACKGROUND OF THE INVENTION

Modern digital oscilloscopes can acquire an electrical signal under test and store digital data corresponding to the acquired signal as a data record. Such oscilloscopes can be used to display one or more waveforms while acquiring the electrical signal under test. In addition, the previously-stored digital data from the data record can be viewed as a waveform on a display of the oscilloscope even though acquisition of the electrical signal under test has stopped. While older oscilloscopes would generally acquire a relatively small data record corresponding to an amount of time that could be displayed, advancements in the areas of memory speed, memory capacity, and processor speed have led to newer oscilloscopes having improved functionality in this area. Consider that most digital oscilloscopes now have the capability of storing a significantly larger data record, which corresponds to more time than can reasonably be displayed at once.

As a result of the larger data records, additional functionality can be made available to the user. For example, most oscilloscopes allow a user to adjust a horizontal or vertical control, thereby changing a position of the waveform on the display. In addition, some oscilloscopes allow a user to "scroll" through the waveform—particularly after the data record has been acquired. However, since the data record now represents much more time than can be displayed at one time, the time interval of user's interest may be short compared to the full acquired record, and scrolling through an entire data record can be impractical. This causes difficulty in finding and analyzing the time interval of interest. Moreover, the full record may contain other events of interest that are different from the one event being displayed.

Some oscilloscopes provide a search feature to flag events of interest in the data record. But due to the rapid advancements in memory capacities, the size of data records continues to expand, which can hinder or otherwise slow down conventional search techniques. Further, such search features require controls or interfaces separate from those with which the users are most familiar.

When viewing a short period of time, the oscilloscope samples the analog signal at a maximum sample rate. The record length of these waveforms is short. For example, when viewing 50 ns with a sample rate of 4 GS/s the record length is 200 samples. Although only a very small number of samples are needed, the oscilloscope acquisition memory is much larger, for example, 40 million samples long. The oscilloscope can be designed to always acquire the full 40 million samples even when the user has only asked to see 50 ns of time. By acquiring this extra data the user can stop the acquisition process and then view portions of the signal outside the original 50 ns time period. This can be useful. However, acquiring a full record takes a considerable amount of time. To acquire 40 million samples at 4 GS/s takes 10 ms. In such a case, the waveform drawing rate is limited to less than 100 waveforms each second.

In order to obtain high waveform throughput, the user can specify a shorter record length, such as a record length of 1,000 samples. However, if the user now stops the acquisition process the instrument has only acquired 1,000 samples and the user is limited to viewing a short period of time even if the oscilloscope has an acquisition memory record length which is considerably longer than 1,000 samples. US patent application Publication 2007/0226406 by Terrance R. Beale et al., discloses a way to write multiple (possibly overlapping) shorter waveforms into a long memory. However, with this technique information between the shorter waveforms may be lost.

What is desired is a way to acquire long records even when a user asks to view a short period of time while also displaying waveforms at rates that are much higher than the acquisition rate of the long record.

SUMMARY OF THE INVENTION

An apparatus and method for displaying a waveform of a signal under test for a relatively short time interval of user's interest at high throughput, acquires the signal under test in a large acquisition memory in order to display a waveform outside the time interval of interest, when desired.

Specifically, the present invention relates to a waveform display apparatus such as an oscilloscope, logic analyzer, etc. In one embodiment, it includes an interface for setting a time interval of user's interest and trigger criteria, and an input terminal for receiving a signal under test. An analog-to-digital converter associates with the input terminal and receives the signal under test to produce digital data from the signal under test. An acquisition memory stores the digital data of the signal under test wherein the acquisition memory may store a considerably large number of data relative to the data for the time interval of interest using the full memory length. A display device displays one or more waveforms associated with the signal under test wherein the waveforms could be overlaid. A trigger unit detects one or more trigger events in the signal under test based on the trigger criteria to produce trigger event information. A trigger list memory stores the trigger event information as a trigger list based on the trigger criteria. A control unit includes a controller such as a CPU for locating the digital data in the acquisition memory corresponding to the trigger event based on the trigger list and displaying a waveform associated with the trigger event for the time interval with the display device.

In one embodiment, the trigger unit includes a digital trigger circuit and reads the digital data of the signal under test stored in the acquisition memory to detect the one or more trigger events in the signal under test based on the trigger criteria to produce the trigger event information as the trigger list.

The trigger list may have a number of trigger event information that may be larger than needed for a user to reasonably review the associated waveforms. In such a case, some of the detected trigger events may be eliminated based on pre-trigger and post-trigger conditions that are set with the interface. Alternatively, some of the trigger events may be eliminated by selecting any arbitrary subset of the trigger events in the trigger list.

In an embodiment, the display device displays the locations of the trigger events in the trigger list relative to the data record length of the acquisition memory. The data record length of the acquisition memory is displayed as a bar and the locations of the trigger events are indicated on the bar. Further, a view window is displayed on the bar to indicate which portion of the data record in the acquisition memory is used to display a waveform on the screen of the display device.

In an embodiment, the display device displays a composite waveform that is derived from waveforms associated with the trigger events corresponding to the trigger event information in the trigger list for the time interval. The composite waveform is displayed in a grayscale display based on how often the data of the waveform appears at each pixel on the screen of the display device. The DPO series oscilloscopes, manufactured by Tektronix, Inc., Beaverton, Oreg., provides such a composite waveform of a signal under test, for example. A waveform display apparatus according to the present invention especially allows displaying the composite waveform at a rate much higher than the acquisition rate of the long record of the conventional oscilloscope by using the trigger list for the short time interval of interest. The user can change how many and which waveforms are used for producing the composite waveform.

According to another view point of the present invention, it relates to a method of displaying a waveform. A time interval of interest and trigger criteria are set and a signal under test is received and converted into digital data that is stored in an acquisition memory. One or more trigger events in the signal under test are detected based on the trigger criteria to produce trigger event information corresponding to the trigger events. The trigger event information based on the trigger criteria is stored as a trigger list in a trigger list memory. Then, the digital data in the acquisition memory corresponding to the trigger event is located based on the trigger list to display a waveform associated with the trigger event for the time interval.

According to additional view point of the present invention, it is a method for displaying a waveform that receives a signal under test as digital data to store them in a memory. For example, the digital data of the signal under test is acquired by an oscilloscope or logic analyzer in advance and then a personal computer (PC) receives the digital data to store them in the memory that may be a hard disk drive (HDD), flash memory, etc. A time interval of interest and trigger criteria are set and one or more trigger events in the signal under test are detected based on the trigger criteria to produce trigger event information. The trigger event information based on the trigger criteria is stored as a trigger list in the memory. The digital data in the memory corresponding to the trigger event is located based on the trigger list to display a waveform associated with the trigger event for the time interval.

BRIEF DESCRIPTION OF THE DRAWINGS

FIGS. 6A, 6B, 6C, and 6D are examples of a bar display including a view window and trigger events for pan and zoom operation, in accordance with an embodiment of the subject invention.

DETAILED DESCRIPTION

Figure 1:
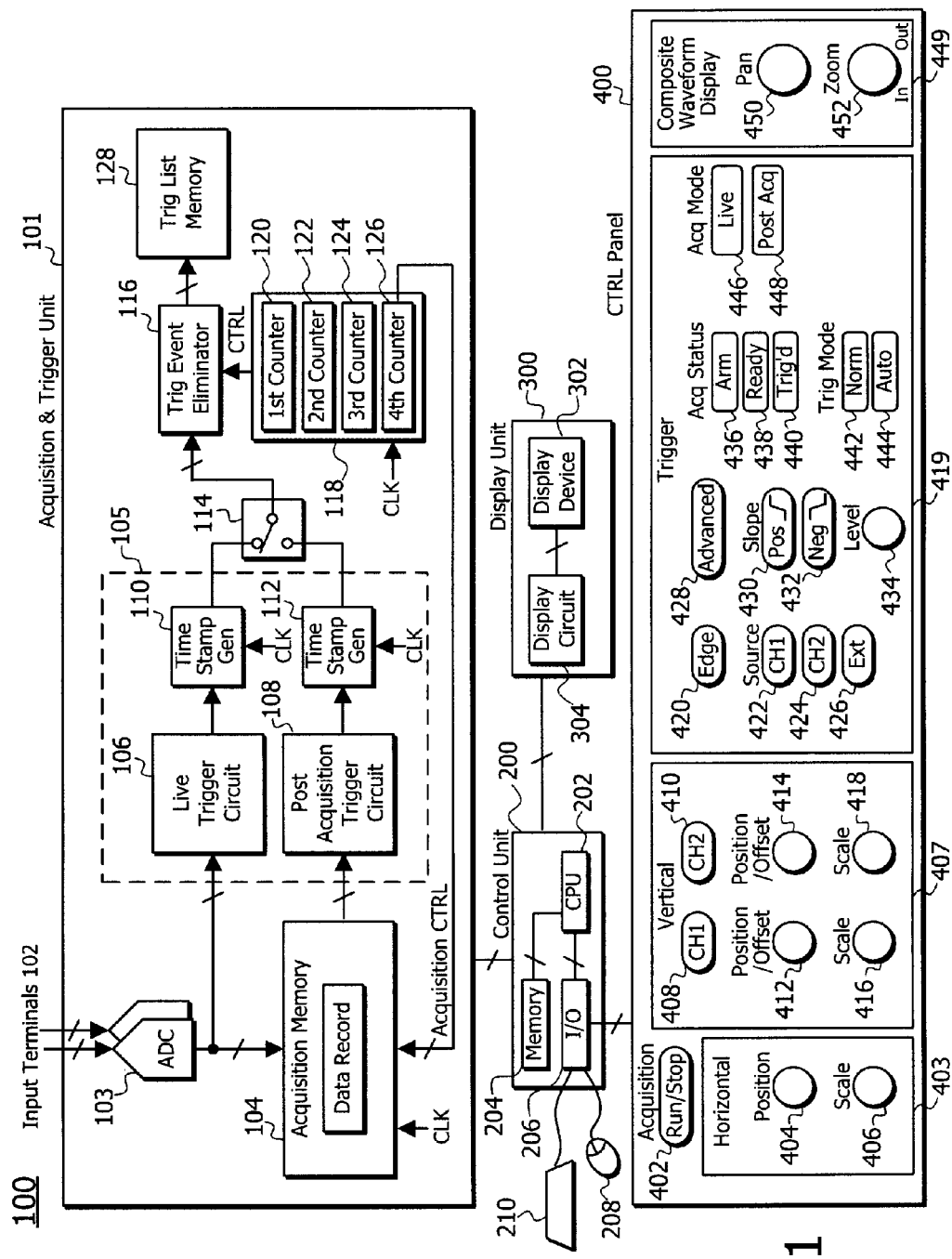
FIG. 1 is a block diagram of a waveform display apparatus including an acquisition and trigger unit, a control unit, a display unit and control panel (a part of an interface) according to an embodiment of the present invention.

FIG. 1 is a block diagram of a waveform display apparatus 100 including an acquisition and trigger unit 101, a control unit 200, a display unit 300 and a control panel 400 according to an example embodiment of the present invention. The waveform display apparatus 100 may typically be a digital oscilloscope. The oscilloscope 100 in FIG. 1 has two channels or inputs suitable for use with various embodiments as described herein but inventive aspects described are equally applicable to an oscilloscope having four inputs, or any number of inputs.

Analog-to-digital converters (ADCs) 103 convert signals under test from the two input terminals (two channels) into digital data (digital samples). An acquisition memory 104 stores an amount of digital data which amount may be much larger than the data length that a user may be interested in. Although the acquisition memory 104 is shown as a single block, it should be understood that the acquisition memory 104 can include multiple discrete memories.

The acquisition and trigger unit 101 has similar circuits for the respective channels. For simplicity, only the circuits for the first channel are described below. A live trigger circuit 106 receives the digital data from the ADC 103 to detect one or more trigger events in the signal under test. It should be understood that an alternative embodiment includes the live trigger circuit 106 may be an analog trigger circuit, coupled to one of the input terminals 102 before the ADC 103 to receive the signal under test of an analog signal. The live trigger circuit 106 may detect all of the live trigger events in the signal under test based on first trigger criteria set by a user. If the live trigger circuit 106 detects the trigger events, a time stamp generator 110 generates time stamps of the respective trigger events.

A post acquisition trigger circuit 108 receives the digital data of the signal under test stored in the acquisition memory. The post-acquisition trigger circuit 108 may detect all of the post-acquisition trigger events in the digital data based on second trigger criteria set by the user. The user may set the second trigger criteria set after acquisition stopped. When the post-acquisition trigger circuit 108 detects the trigger events, a time stamp generator 112 generates time stamps of the respective trigger events.

The trigger circuits 106 and 108, while shown as two separate circuits, may be implemented with one set of hardware serving both the live trigger circuit function and the post-acquisition circuit function, for example, at different times. Alternatively, the live trigger circuit 106 and the post-acquisition circuit 108 are separate from each other, each of which may include similar circuits as the other. The trigger circuits 106 and 108 may be digital trigger circuits as disclosed by Sullivan et al., U.S. Pat. No. 7,352,167, for example.

When the oscilloscope 100 is in a live trigger mode, a switch 114 receives and provides the time stamps from the time stamp generator 110 to a trigger event eliminator 116. Alternatively, when the oscilloscope 100 is in a post-acquisition trigger mode, the switch 114 receives and provides the time stamps from the time stamp generator 112 to the trigger event eliminator 116. The live and post-acquisition trigger modes are described in detail below. The trigger event eliminator 116 passes or eliminates the time stamps under control of a state machine 118 and provides the passed time stamps to a trigger list memory 128. The trigger list memory 128 stores the passed time stamps as a trigger list. The state machine 118 may be implemented in a Field Programmable Gate Array (FPGA) and the detailed operation is described below. The trigger list memory 128 may be a circular memory and if it fills up the data is discarded sequentially from the oldest one. FIG. 1 shows the acquisition memory 104 and the trigger list memory 128 separately, but the trigger list memory 128 may be a part of the acquisition memory 104.

The control unit 200 is operatively coupled to the acquisition and trigger unit 101 and the display unit 300, and processes the sampled data streams provided by the acquisition and trigger unit 101 for displaying a waveform with the display unit 300. The control unit 200 may have hardware similar to a personal computer including a CPU 202, a memory 204 and an input/output (I/O) circuit 206. The memory 204 may include any, or all of: a hard disk drive (HDD), a flash memory, and a RAM. The RAM is usually used for temporarily storing data processed by the CPU 202. The HDD and/or flash memory may store a large amount of data and software including operating software (OS) as used in the PC so that the oscilloscope 100 can provide a graphical user interface similar to the PC.

The I/O circuit 206 provides communication between various elements and the control unit 200. For example, the I/O circuit 206 may comprise an interconnection to a keypad 210, a pointing device (mouse) 208, a control panel 400, touch screen with a display device 302, an external PC (not shown), or other peripheral devices adapted to provide user input and output to the control unit 200. The control unit 200, in response to such user input, controls the operations of the acquisition and trigger unit 101, to perform various functions.

The control unit 200 provides the waveform data to the display unit 300. The display unit 300 has a display circuit 304 that includes a display memory (not shown) and processes the waveform data into a rasterized image data to display the waveform on the screen of the display device 302. The display device 302 may be a liquid crystal display (LCD), for example.

The control panel 400 forms a part of the user interface of the oscilloscope 100 and allows the user to control the oscilloscope 100. If the user pushes a Run/Stop button 402, the oscilloscope 100 starts the acquisition of the signal under test, and the next push of the Run/Stop button 402 stops the acquisition. A trigger control area 419 allows a user to control trigger conditions and has various indicators 436-448 that show various trigger status. If an Edge button 420 is pressed, the oscilloscope 100 triggers the signal under test by trigger criteria of the edge trigger wherein a rising or falling edge is selected by pressing one of positive or negative slope buttons 430 and 432. A level control knob 434 is used for adjusting a threshold level of the edge trigger. Also, the user may set complicated trigger criteria by pressing an Advanced button 428 which leads to a showing of various trigger menu selections on the display screen. The advanced trigger criteria may be Pinpoint® trigger functions, as in the DPO70000B series oscilloscope manufactured by Tektronix, Inc., for example.

A horizontal control area 403 has horizontal position and scale control knobs 404 and 406. A waveform displayed on the display screen moves left or right by turning the position control knobs 404. If the scale control knob 406 is turned, the horizontal time axis scale of the display screen is changed.

Figure 2:
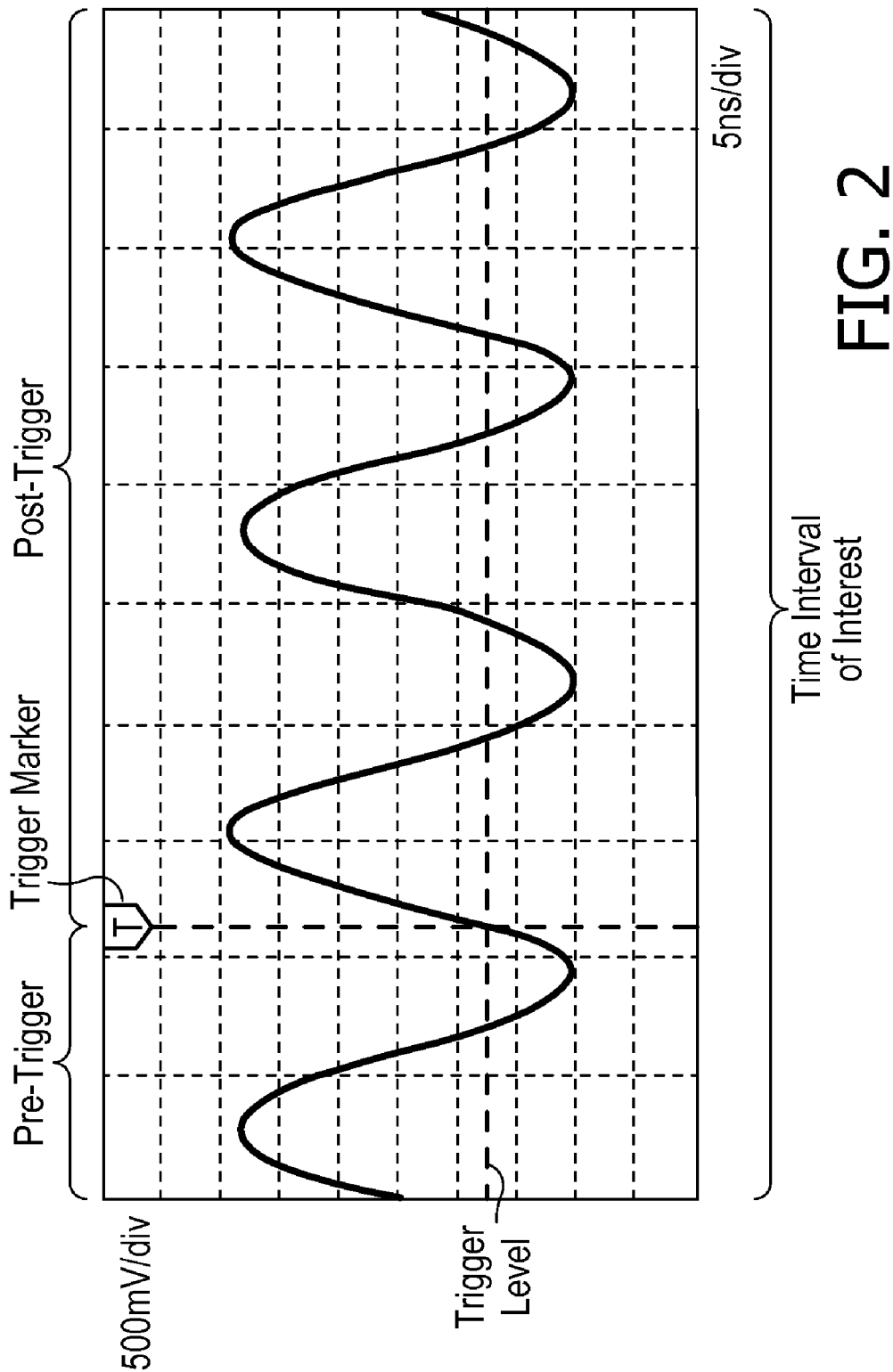
FIG. 2 is a diagram showing relationship between a time interval of interest, and pre/post trigger, as known from the prior art.

The user may also use the horizontal scale control knob 406 to determine a time interval of user's interest. FIG. 2 shows a display example on the screen of the display device 302 wherein each of the horizontal and vertical axes of the screen has 10 divisions and the screen may show a waveform previously acquired or under acquisition. The user can see a time interval of user's interest as a width of the screen. If the user changes the horizontal time axis scale by turning the scale control knob 406, the horizontal time per division is changed, causing the length of the time interval of user's interest for a trigger event to be changed. If the user turns the horizontal position control knob 408, the position of a trigger marker changes on the screen, which changes a ratio between the pre-trigger and post-trigger and determines the pre-trigger and post-trigger conditions for a trigger event. The pre-trigger and post-trigger conditions may be represented by sample numbers or time lengths of the respective pre-trigger and post-trigger areas. Other operations of the control panel are described below along with operations associated with the present invention.

In a conventional oscilloscope, the process of storing data into the acquisition memory often stops as soon as a post-trigger condition is satisfied and one set of the acquired data stored in the acquisition memory, typically using its full length, is then processed to make a waveform display. This large amount of data makes the display throughput worse. In the present invention the acquisition process is not usually stopped even if a post-trigger condition for each trigger event is satisfied but continues until some other conditions are satisfied. Therefore, an oscilloscope according to the present invention may provide a plurality of sets of waveform data from the acquisition memory based on a trigger list for one acquisition process to make a waveform display wherein each set of the waveform data may have a considerably short length compared to the full length of the acquisition memory, if the user sets a short time interval. This makes it possible to display a waveform at high throughput while the full memory length of the large acquisition memory is used.

Figure 3:
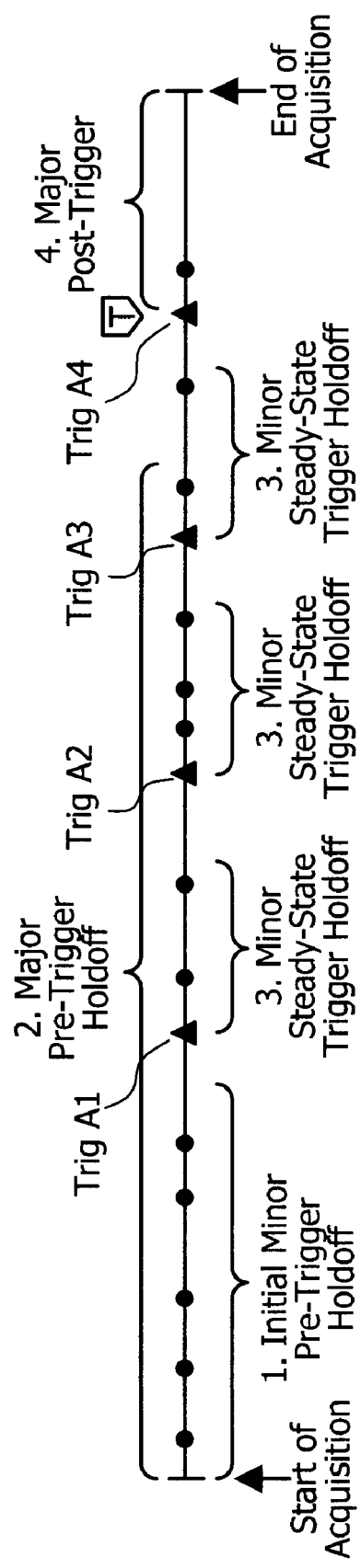
FIG. 3 is a time diagram showing trigger events during the acquisition process, in accordance with an embodiment of the subject invention.

FIG. 3 is a time diagram showing trigger events during the acquisition process. In FIG. 3, circles indicate trigger events that are recognized by the trigger circuit 106 but eliminated by the eliminator 116. Triangles indicate trigger events that are recognized by the trigger circuit 106 and not eliminated by the eliminator 116 and which are recorded in a trigger list.

The state machine 118 is deemed to have four counters 120, 122, 124 and 126. The first counter 120 may provide an initial minor pre-trigger holdoff before a trigger A1 by counting sample clocks until reaching a predetermined sample number which is determined by the pre-trigger condition that is described above. The second counter 122 may provide a major pre-trigger holdoff before a trigger A4 by counting sample clocks until reaching a predetermined sample number which is less than the number obtained by subtracting the sample numbers determined by the post-trigger condition from the maximum number of samples in the acquisition record in the memory 104. The third counter 124 may provide a minor steady-state trigger holdoff by counting sample clocks until reaching a predetermined sample number which is less than the sum of the sample numbers determined by the pre-trigger and post-trigger conditions. The fourth counter 126 may provide a major post-trigger time following the trigger A4 by counting sample clocks until reaching the sample number determined by the post-trigger condition. The above sample clock counting numbers of the four counters are described only as a rough guideline and may be adjustable. Additionally, the user may adjust the sample numbers set in the four counters 120, 122, 124 and 126 by providing an associated menu displayed on the display screen.

Also, other holdoff circuits may be employed to provide a predetermined holdoff time following each trigger event to distribute the trigger events over the acquisition record in the acquisition memory 104.

Figure 4:
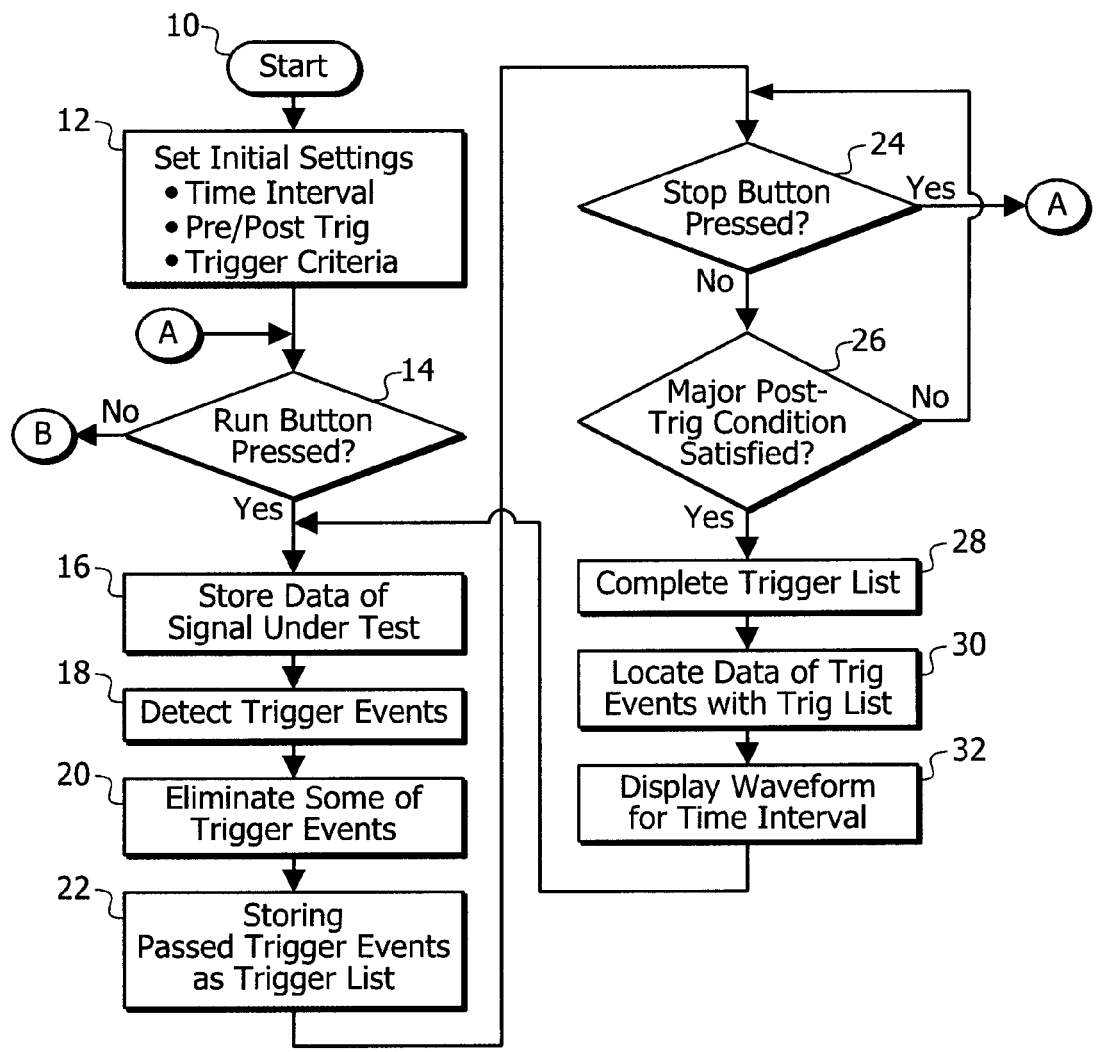
FIG. 4 is an example flowchart according to the present invention showing a process flow occurring mainly when the acquisition process is running.
Figure 5:
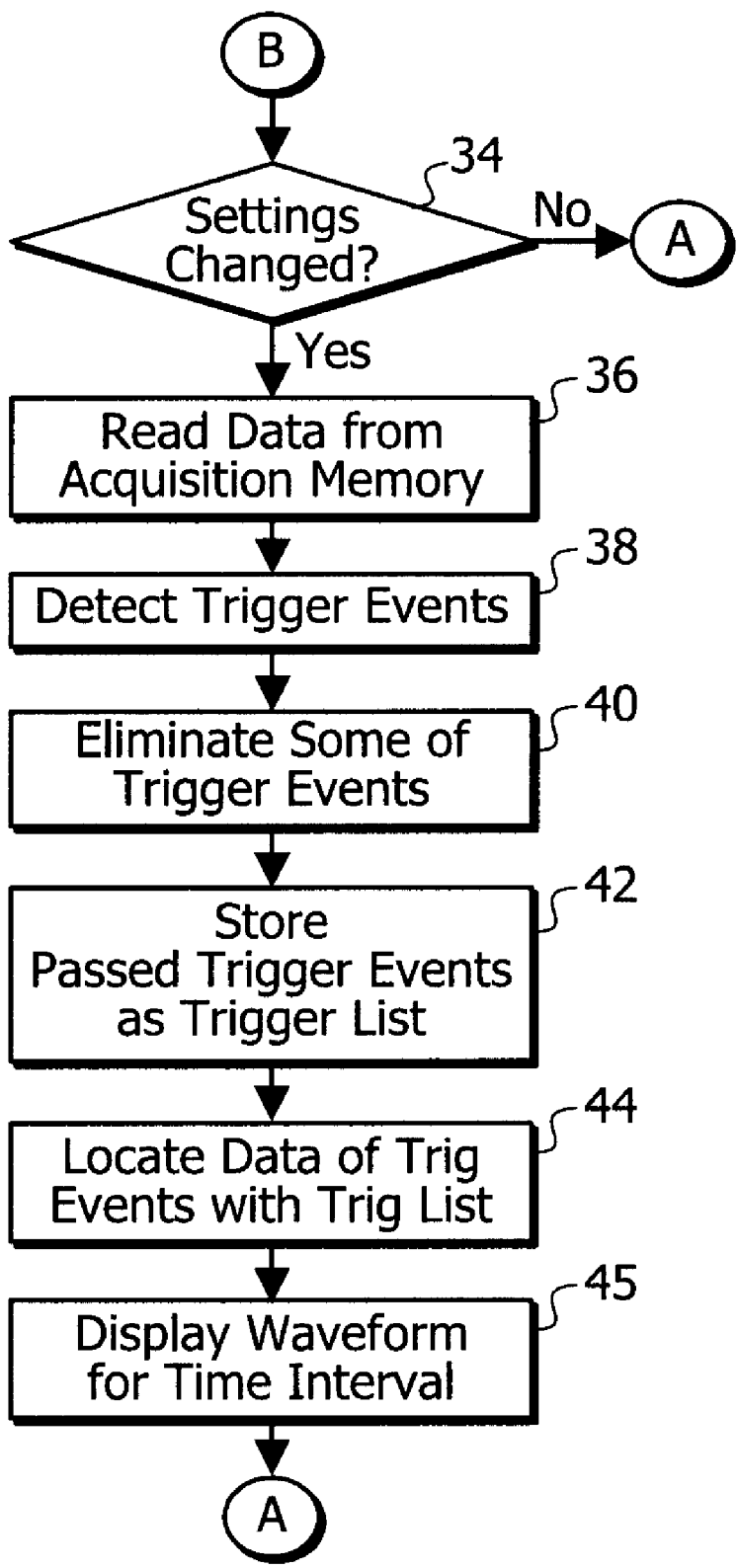
FIG. 5 is an example flowchart according to the present invention showing a process flow after the acquisition process is stopped.

FIGS. 4 and 5 are flowcharts of an embodiment of the present invention. At first, the user sets initial settings including a time interval of user's interest and the desired trigger criteria. The initial settings may further include pre and post trigger conditions. When the user presses the Run/Stop button 402 (step 14), the oscilloscope starts to acquire the digital data of the signal under test for storing them in the acquisition memory 104 (step 16). When the acquisition starts, the acquisition start time stamp is separately stored in the memory 204. The live trigger circuit 106 detects trigger events in the signal under test and the time stamp generator 110 generates the corresponding time stamps (step 18). The time stamps are trigger event information items. The trigger eliminator 116 may eliminate some of the time stamps corresponding to the trigger events (step 20) and the passed time stamps of the trigger events are stored as a trigger list in the trigger list memory 128 until the major post-trigger condition is satisfied (step 26) if the Run/Stop button 402 is not pressed again (step 24). Then, the trigger list has completed (step 28). It can be determined when each of the digital data is acquired because the acquisition start time stamp is stored and the sample clock frequency is known. Therefore the control unit 200 can locate the data corresponding to the trigger event based on the trigger event information in the trigger list using the time stamps of the trigger events. At step 32, the oscilloscope 100 displays all of the waveforms associated with the trigger events noted in the trigger list as the trigger event information for the relatively short time interval of interest at high throughput while the oscilloscope 100 acquires long data record of the signal under test including outside the time interval of interest in the long acquisition memory. After the step 32, the processes from the step 16 to the step 32 are repeated until the Run/Stop button 402 is pressed again to stop the acquisition at the step 24. If the Run/Stop button 402 is pressed to stop the acquisition at the step 24, the process returns to the step 14.

If the Run/Stop button 402 is not pressed to start the acquisition at the step 14, the user may change the settings of the time interval of user's interest, the trigger criteria, and/or the pre and post trigger conditions (step 34 of FIG. 5). Then, the control unit 200 controls the post-acquisition circuit 108 to read the data from the acquisition memory 104 (step 36) and a "Post Acq" indicator 448 (see FIG. 1) illuminates to indicate it is in a post-acquisition mode. The trigger eliminator 116 may eliminate some of the time stamps corresponding to the trigger events (step 40) and the passed time stamps of the trigger events are stored as a new trigger list based on the changed settings in the trigger list memory 128 (step 42). The control unit 200 can locate the data corresponding to the trigger events based on the trigger event information in the new trigger list using the time stamps of the trigger events (step 44). At step 45, the oscilloscope 100 displays all of the waveforms associated with the trigger events noted in the new trigger list as the trigger event information for the relatively short time interval of interest at high throughput based on the changed settings without newly acquiring data of the signal under test based on the changed settings. It previews a waveform(s) based on the changed settings before acquiring new data of the signal under test so that it is also called "preview mode".

After the waveform display in the preview mode at the step 45, the process returns to the step 14. If the user presses the Run/Stop button 402 again to start the acquisition at the step 14, trigger events are detected according to the settings changed at the step 34. If the Run/Stop button 402 is not pressed at the step 14, the process returns to the step 34. If the settings of the time interval of user's interest, the trigger criteria, and/or the pre and post trigger conditions are changed again at the step 34, the oscilloscope 100 previews a waveform(s) based on the changed settings without acquiring new data of the signal under test again. The flowchart shown in FIGS. 4 and 5 is ended when the power to the oscilloscope 100 is turned off.

As described, the oscilloscope according to the present invention reflects a trigger setting change on the displayed waveform quickly, even when the acquisition is stopped. On the other hand, a conventional oscilloscope never reflects a trigger setting change on the displayed waveform when the acquisition is stopped.

The oscilloscope 100 according to the present invention displays one or more waveforms associated with the one or more trigger events noted as the corresponding trigger event information in the trigger list, as separate waveforms from each other or as a composite waveform derived from the waveforms on the screen in a composite display mode even when the acquisition is stopped. Referring to FIG. 1, a composite waveform display area 449 has Pan and Zoom control knobs 450 and 452 to change the trigger event(s) used for producing the composite waveform. Referring to FIG. 6A, a trigger event B8, or the last trigger event in the trigger list, is selected and the waveform associated with the trigger event B8 is displayed by default wherein the width of a main view window 62 corresponds to the time interval of interest and the displayed area on the display screen of the display device 302, and a bar 60 corresponds to a full data record length in the acquisition memory 104. By turning the knob 450 to left, the main view window 62 is shifted to left to select the left trigger event B3 wherein the width of the main view window 62 is kept as the same one and the trigger position (see FIG. 2) in the window 62 is also kept at the same position. Therefore, the waveform is also displayed at high throughput.

Besides, the oscilloscope according to the present invention may display the composite waveform that is derived from waveforms associated with some of the trigger events noted as the trigger event information in the trigger list. The Zoom control knob 452 allows the user to control zoom in or out of the trigger events used for producing the composite waveform. In case of zoom-out, more trigger events around the main view window 62 in the trigger list are selected with sub view windows 64 and 66 as shown in FIG. 6C and the composite waveform is derived from the waveforms associated with the selected trigger events. FIG. 6D shows a case of moving the view windows to right relative the case of FIG. 6C by panning to right operation with the Pan control knob 450.

The repetitive pan and zoom operations allow the user to locate unusual events quickly. For example, in the case of an unusual event found by a zoom out operation, the user may know how close it is to the unusual event depending on how much rotation of the Zoom control knob 452 is required for displaying the event. Then, the user turns the Pan control knob 450 to determine that this pan operation makes the main view window position get closer or not to the unusual event by turning the Zoom control knob 452 again. These repetitive operations result in displaying the unusual event with a few, or one, view window so that the user locates the event. Note that the repetitive pan and zoom operations do not require the display of a composite waveform derived from all of the trigger events in the acquisition memory, which is different from the operation of a conventional oscilloscope.

Further, the main view window 62 may be moved by dragging it with a mouse cursor 70 by the mouse 208. The view window may be copied as another sub view window to increase the total number of the view windows for increasing the selected trigger events, by dragging it with the mouse cursor 64 while pressing a CTRL key of the keypad 210.

The mouse cursor 64 may also be used to temporarily deselect any arbitrary subset of the trigger events in the trigger list on the bar 60 by highlighting the trigger events and pressing a delete key of the keypad 210.

Figure 7:
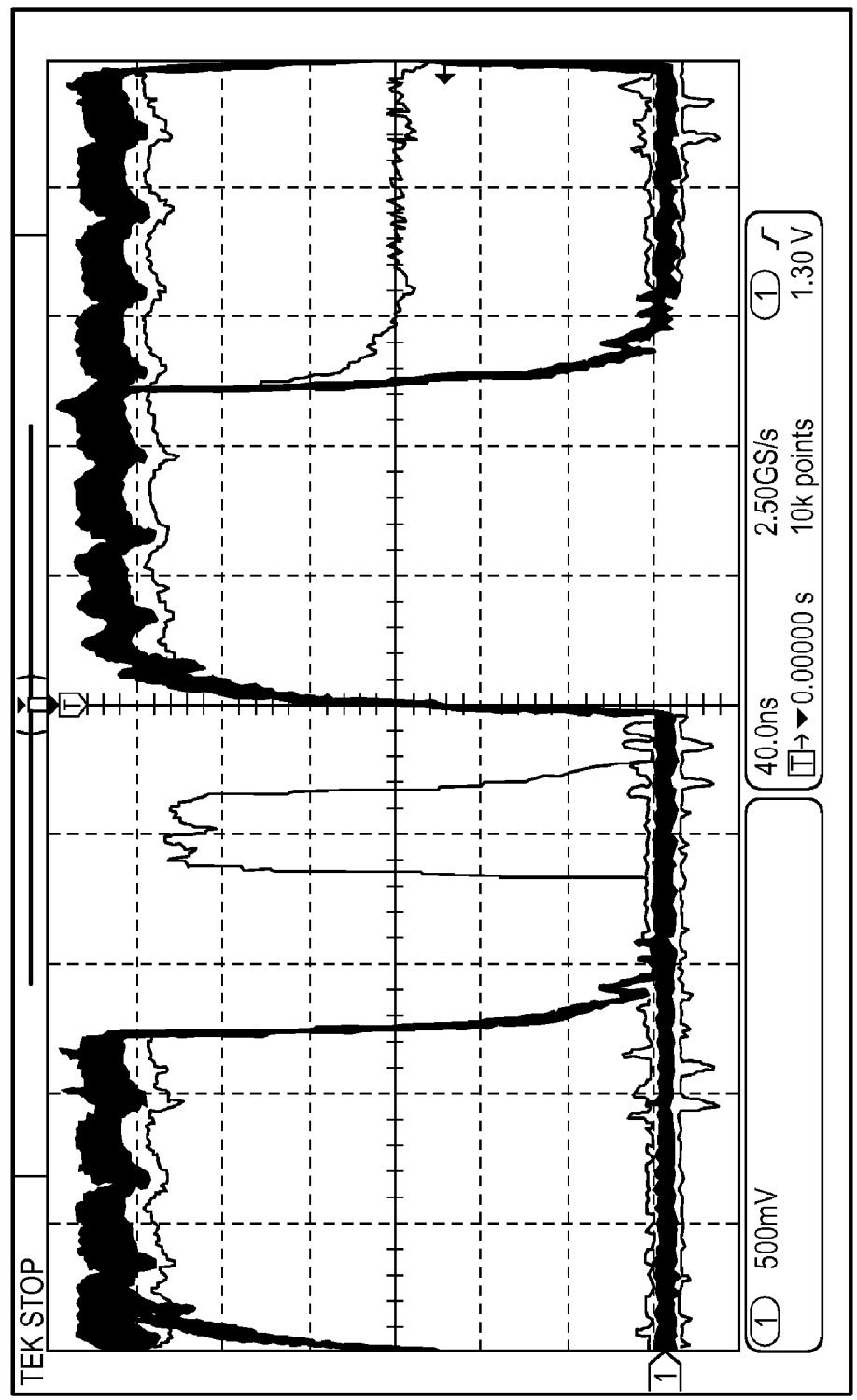
FIG. 7 is an example of display of a composite waveform in accordance with an embodiment of the subject invention.

FIG. 7 shows an example of a composite waveform that employs gray scale to visually convey information relating to how often the data appears at each pixel. Conventional DPO series oscilloscopes manufactured by Tektronix, Inc., Beaverton, Ore., can provide such a composite waveform display of the signal under test, although conventional DPO series oscilloscopes have not heretofore used the trigger list according to the present invention.

Figure 8:
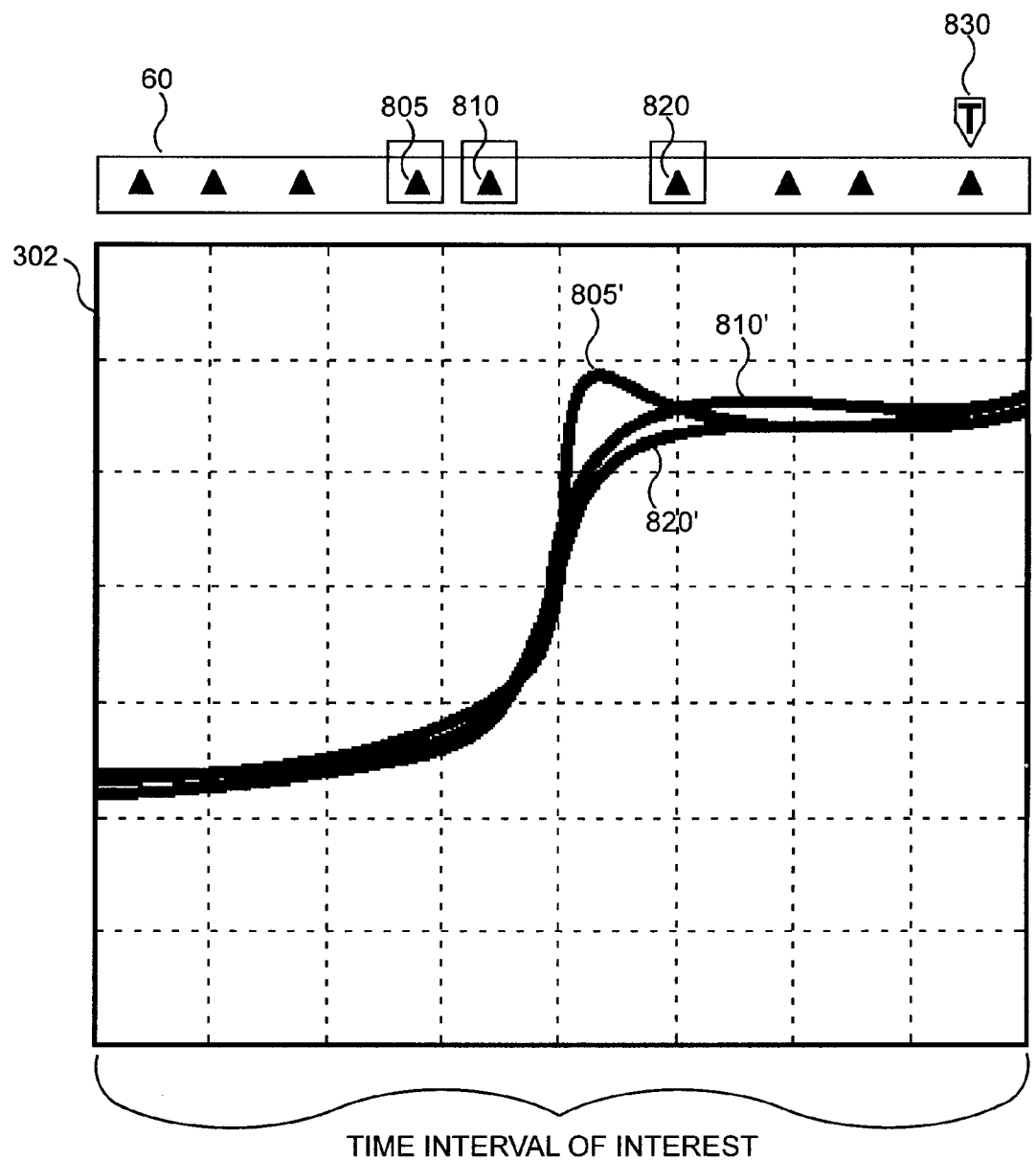
FIG. 8 is an example of a display of a composite waveform showing an association of the individual waveforms with their respective trigger events, in accordance with an embodiment of the subject invention.

Referring to FIG. 8, Bar 60 includes Trigger Event Indicators 805, 810, and 820, among others that precede Main Trigger Event Indicator 830. Each of Trigger Event Indicators 805, 810, and 820 is highlighted by being enclosed by a rectangular window, or box, to indicate that those particular Trigger Event Indicators have been selected by a user. Other highlighting methods, such a color change in text or immediate background area, may also be used. Display Screen 302 is shown displaying a composite waveform composed of three individual waveforms 805', 810', and 820', each of which relates to trigger events indicated by Trigger Event Indicators 805, 810, and 820, respectively. As shown in FIG. 8, the screen width corresponds to the user's time interval of interest. That is, by selecting Trigger Event Indicators 805, 810, and 820, the user has caused CPU 202 to find, select, and display, the waveform data associated with those three trigger events. Advantageously, with apparatus according to the subject invention, any or all of the trigger events shown in bar 60 may be selected for viewing on Display screen 302, unlike the operation of a conventional digital storage oscilloscope.

Although particular embodiments have been described, it will be appreciated that the principles of the invention are not limited to those embodiments. For example, the waveform display apparatus according to the present invention can be a logic analyzer wherein the logic analyzer has a comparator in each channel to produce logical "1" and "0" as digital data and the acquisition memory 104 stores the digital data. The trigger events are stored as time stamps in the above embodiment but the trigger events may be stored as another type of information. For example, address locations of the acquisition memory may be used for the trigger event information. If the digital data of the signal under test is acquired by an oscilloscope or logic analyzer in advance, then a personal computer (PC) could be a waveform apparatus according to the present invention by copying the data to the memory such as an HDD of the PC. Then, the PC may conduct the processes described above. Variations and modifications may be made without departing from the principles of the invention as set forth in the following claims.

The invention claimed is:

1. A waveform display apparatus, comprising:
   an interface, operable by a user, for setting time interval of interest and for setting trigger criteria;
   an input terminal for receiving a signal under test;
   an analog-to-digital converter coupled to the input terminal, the analog-to-digital converter receiving the signal under test and producing digital data from the signal under test;
   an acquisition memory for storing the digital data of the signal under test as a contiguous data record having a time duration longer than the time interval of interest;
   a trigger unit for detecting a plurality of trigger events in the signal under test based on the trigger criteria to produce a plurality of respective trigger event information items within the data record;
   a trigger list memory for storing the plurality of trigger event information items as a trigger list, based on the trigger criteria;
   a control unit for locating the digital data in the acquisition memory based on the trigger event information items in the trigger list; and
   a display device for displaying a plurality of waveforms associated with the signal under test; each waveform corresponding to a respective one of the trigger event information items and within the time interval of interest, the time interval of interest being a subset of the contiguous data record.

2. The waveform display apparatus as recited in claim 1 wherein the trigger criteria may be changed after the storing of the digital data has stopped, and thereafter, the trigger unit reads the digital data of the signal under test in the acquisition memory to detect the one or more trigger events in the signal under test based on the changed trigger criteria to produce the trigger event information as the trigger list.

3. The waveform display apparatus as recited in claim 1, further comprising means for eliminating some of the trigger events based on pre-trigger and post-trigger conditions that are set with the interface.

4. The waveform display apparatus as recited in claim 1, further comprising means for eliminating some of the trigger events by selecting a subset of the trigger events corresponding to the trigger event information in the trigger list.

5. The waveform display apparatus as recited in claim 1 wherein the display device displays the locations of the trigger events based on the trigger event information in the trigger list relative to the data record length of the acquisition memory.

6. The waveform display apparatus as recited in claim 1 wherein the display device displays a composite waveform that is derived from waveforms associated with the trigger events corresponding to the trigger event information in the trigger list for the time interval.

7. The waveform display apparatus as recited in claim 6 wherein the interface has means for changing the width of a range of the trigger events corresponding to the trigger event information in the trigger list used for producing the composite waveform.

8. The waveform display apparatus as recited in claim 6 wherein the interface has means for changing the position of a range of the trigger events corresponding to the trigger event information in the trigger list used for producing the composite waveform.

9. The waveform display apparatus as recited in claim 6 wherein the interface has means for temporarily deselecting a selected trigger event from the trigger list.

10. A method for displaying a waveform comprising steps of:
    setting a time interval of interest and setting trigger criteria;
    receiving a signal under test;
    converting the signal under test into digital data;
    storing the digital data of the signal under test in an acquisition memory as a contiguous data record having a time duration longer than the time interval of interest;
    detecting a plurality of trigger events in the signal under test based on the trigger criteria to produce trigger event information items corresponding to each of the trigger events;

storing the trigger event information items as a trigger list in a trigger list memory;

locating the digital data in the acquisition memory corresponding to the trigger event information items in the trigger list; and displaying waveforms associated with the plurality of trigger events, wherein each waveform corresponds to one trigger event information item and contains the time interval of interest, the time interval of interest being a subset of the contiguous data record.

11. The method for displaying a waveform as recited in claim 10 wherein the trigger criteria may be changed after the storing of the digital data has stopped, and thereafter the digital data of the signal under test in the acquisition memory are read to detect the one or more trigger events in the signal under test based on the changed trigger criteria to produce the trigger event information as the trigger list.

12. The method for displaying a waveform as recited in claim 10, further comprising steps of:

setting pre-trigger and post-trigger conditions; and eliminating some of the trigger events based on the pre-trigger and post-trigger conditions.

13. The method for displaying a waveform as recited in claim 10, further comprising a step of eliminating some of the trigger events by selecting a subset of the trigger events corresponding to the trigger event information in the trigger list.

14. The method for displaying a waveform as recited in claim 10, further comprising a step of displaying the locations of the trigger events based on the trigger event information in the trigger list relative to the data record length of the acquisition memory.

15. The method for displaying a waveform as recited in claim 10 wherein the displayed waveform is a composite waveform that is derived from waveforms associated with the trigger events based on the trigger event information in the trigger list for the time interval.

16. The method for displaying a waveform as recited in claim 15, further comprising a step of changing the width of a range of the trigger events based on the trigger event information in the trigger list used for producing the composite waveform.

17. The method for displaying a waveform as recited in claim 15, further comprising a step of changing the position of a range of the trigger events based on the trigger event information in the trigger list used for producing the composite waveform.

18. The method for displaying a waveform as recited in claim 15 further comprising the step of highlighting a trigger event in the trigger list and temporarily deselecting the highlighted trigger event from the trigger list.

* * * * *